(12) United States Patent
Lee

(10) Patent No.: US 8,552,569 B2
(45) Date of Patent: Oct. 8, 2013

(54) STACKED SEMICONDUCTOR DEVICE INCLUDING ESD PROTECTION CIRCUITS AND METHOD OF FABRICATING THE STACKED SEMICONDUCTOR DEVICE

(75) Inventor: Hoon Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/517,888

(22) Filed: Jun. 14, 2012

(65) Prior Publication Data

US 2013/0009278 A1    Jan. 10, 2013

(30) Foreign Application Priority Data

Jul. 4, 2011    (KR) ........................ 10-2011-0066051

(51) Int. Cl.
*H01L 29/66* (2006.01)

(52) U.S. Cl.
USPC ............ 257/777; 257/E23.011; 257/E21.499; 438/107; 438/108

(58) Field of Classification Search
USPC .......... 257/777, E23.011, E21.499; 438/107, 438/108
See application file for complete search history.

(56) References Cited

U.S. PATENT DOCUMENTS

| 8,253,230 B2 * | 8/2012 | Janzen et al. ................. 257/686 |
| 2009/0283898 A1 | 11/2009 | Janzen et al. |
| 2010/0059869 A1 | 3/2010 | Kaskoun et al. |
| 2010/0237386 A1 | 9/2010 | Lin et al. |
| 2011/0304010 A1 * | 12/2011 | Jiang et al. ..................... 257/528 |
| 2013/0083436 A1 * | 4/2013 | Tseng et al. .................... 361/56 |

FOREIGN PATENT DOCUMENTS

KR    10-2006-0079010 A    7/2006

* cited by examiner

*Primary Examiner* — Trung Q Dang
(74) *Attorney, Agent, or Firm* — Lee & Morse, P.C.

(57) ABSTRACT

A stacked semiconductor device includes a first semiconductor die that has a front side electrically coupled to a substrate pad, the substrate pad is connected to an exterior, a backside of the first semiconductor die, a first integrated circuit, first ESDs, and TSVs, and the TSVs are coupled to the first integrated circuit and the first ESDs. A second semiconductor die is stacked above the backside of the first semiconductor die, the second semiconductor die includes a second integrated circuit that is electrically connected to the TSVs and second ESDs, and the second ESDs is electrically disconnected from the TSVs. The TSVs penetrate the first semiconductor die and extend to the backside of the first semiconductor die.

20 Claims, 6 Drawing Sheets

STACKED SEMICONDUCTOR DEVICE INCLUDING ESD PROTECTION CIRCUITS AND METHOD OF FABRICATING THE STACKED SEMICONDUCTOR DEVICE

CROSS-REFERENCE TO RELATED APPLICATION

This application claims priority to Korean Patent Application No. 10-2011-0066051 filed on Jul. 4, 2011, in the Korean Intellectual Property Office, and entitled: "Stacked Semiconductor Device Including ESD Protection Circuits and Method of Fabricating the Stacked Semiconductor Device," which is incorporated by reference herein in its entirety.

BACKGROUND

Stacked semiconductor devices may include memory chips that are three-dimensionally stacked. In the stacked semiconductor device, semiconductor memory chips may be electrically connected to each other.

SUMMARY

Embodiments may be realized by providing a stacked semiconductor device including a first semiconductor die that has a front side electrically coupled to a substrate pad, the substrate pad is connected to an exterior, a backside of the first semiconductor die, a first integrated circuit, first electrostatic discharge protection circuits (ESDs), and through-silicon-vias (TSVs), and the TSVs are coupled to the first integrated circuit and the first ESDs. The stack semiconductor device also includes a second semiconductor die stacked above the backside of the first semiconductor die, the second semiconductor die includes a second integrated circuit that is electrically connected to the TSVs and second ESDs, the second ESDs are electrically disconnected from the TSVs, and the TSVs penetrate the first semiconductor die and extend to the backside of the first semiconductor die.

The stacked semiconductor device may include an interposer substrate coupled to the substrate pad. The stacked semiconductor device may include a printed circuit board coupled to the substrate pad. The second semiconductor die may include a cut-off circuit that electrically disconnects the second ESDs from the TSVs. The cut-off circuit may be an anti-fuse circuit or an electric fuse circuit. The second ESDs may be electrically disconnected from the second integrated circuit.

The first semiconductor die may include a first silicon substrate having the first integrated circuit, the first ESDs, and the TSVs, and may include a first metal layer adjacent to the first silicon substrate. The first metal layer may electrically couple the first integrated circuit, the first ESDs, and the TSVs to one another and may electrically couple the first integrated circuit, the first ESDs, and the TSVs to the substrate pad. The first metal layer may include a first conductive line that electrically couples the first integrated circuit, the first ESDs, and the TSVs to one another, a second conductive line electrically coupled to the substrate pad, and contacts that electrically couple the first conductive line and the second conductive line to each other.

The TSVs may extend from the backside of the first semiconductor die to a boundary surface of the first silicon substrate and the first metal layer. The TSVs may extend through the first silicon substrate from the backside of the first semiconductor die to the first metal layer. The second semiconductor die may include a second silicon substrate having the second integrated circuit and the second ESDs, and a second metal layer adjacent to the second silicon substrate. The second metal layer electrically couples the second integrated circuit, the second ESDs, and the TSVs to one another. The second silicon substrate includes a cut-off circuit that electrically disconnects the second ESDs from the TSVs.

Embodiments may also be realized by providing a stacked semiconductor device including a first semiconductor die that has a front side electrically coupled to a substrate pad, the substrate pad is connected to an exterior, a backside of the first semiconductor die, a first integrated circuit, first electrostatic discharge protection circuits (ESDs), and through-silicon-vias (TSVs), and the TSVs are coupled to the first integrated circuit and the first ESDs. The stacked semiconductor device also includes a second semiconductor die that has a second integrated circuit and second ESDs, the second integrated circuit is stacked above the backside of the first semiconductor die and is electrically connected to the TSVs, the second ESDs are electrically disconnected from the TSVs, an interposer substrate is coupled to the substrate pad, and the TSVs penetrate the first semiconductor die and extend to the backside of the first semiconductor die.

The second semiconductor die may include a cut-off circuit that electrically disconnects the second ESDs from the TSVs. The cut-off circuit may be an anti-fuse circuit or an electric fuse circuit.

Embodiments may also be realized by providing a method of fabricating a stacked semiconductor device includes forming a first semiconductor die, the first semiconductor die includes at least one first electro static discharge protection circuit (ESD), at least one through-silicon-via (TSV), and a first integrated circuit that are electrically connected to each other, forming a second semiconductor die, the second semiconductor die is stacked on the first semiconductor die to form a stacked structure, the second semiconductor die includes at least one second ESD and a second integrated circuit, and performing a fusing operation with respect to the second semiconductor die to cut off an electrical connection between the at least one second ESD and the at least one TSV.

The fusing operation with respect to the second semiconductor die may include disconnecting a pad electrically connected to the at least one second ESD from the at least one TSVs using an anti-fuse. The fusing operation may include enabling a cut-off signal of a cut-off circuit that is in the second semiconductor die.

The fusing operation may include forming a cut-off area in the second semiconductor die. The cut-off area may extend through conductive lines in the second semiconductor die such that first portions of the conductive lines are electrically connected to the at least one second ESD and second portions of the conductive lines are connected to the at least one TSV and the second integrated circuit. After the fusing operation, the at least one first ESD may remain electrically connected to the at least one TSV and the first integrated circuit.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
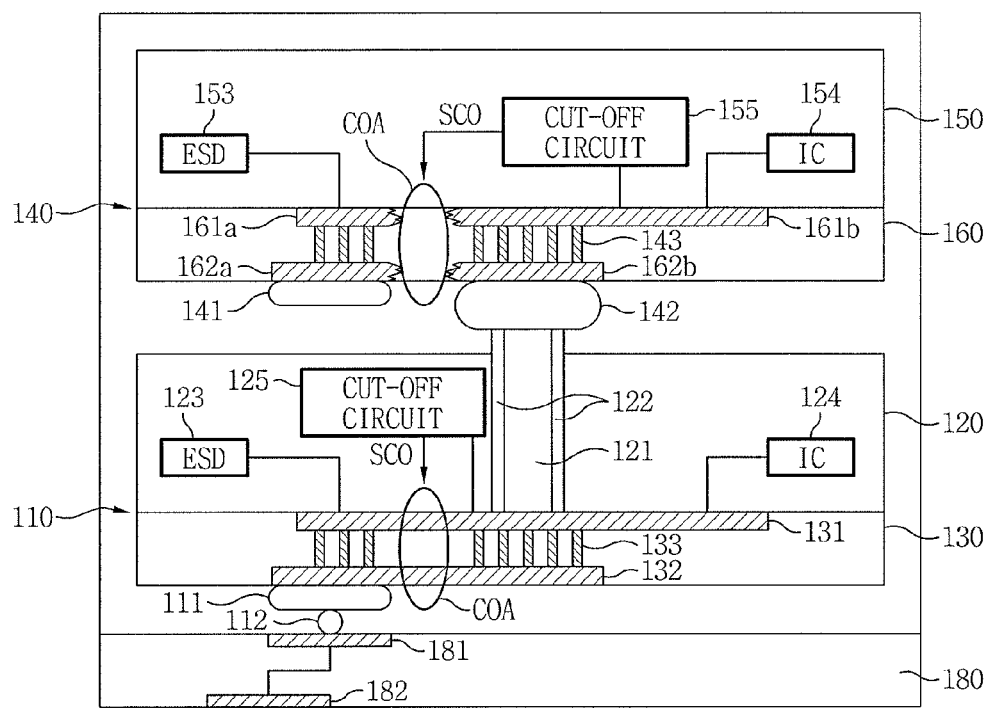
FIG. 1 illustrates a schematic cross-sectional view showing a stacked semiconductor device, in accordance with an exemplary embodiment

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. In the drawing figures, the dimensions of layers and regions may be exaggerated for clarity of illustration.

Like reference numerals refer to like elements throughout. It will be understood that when an element or layer is referred to as being "on," "between," "connected to," or "coupled to" another element or layer, it can be directly on, between, connected, or coupled to the other element or layer or intervening elements or layers may be present. In contrast, when an element is referred to as being "directly on," "directly between," "directly connected to," or "directly coupled to" another element or layer, there are no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings.

Spatially relative terms, such as "above," "below," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, operations, elements, and/or components, but do not preclude the presence or addition of one or more other features, operations, elements, components, and/or groups thereof.

Embodiments are described herein with reference to cross-sectional illustrations that are schematic illustrations of exemplary embodiments (and intermediate structures). As such, variations from the shapes of the illustrations as a result of, e.g., manufacturing techniques and/or tolerances, may be expected. Thus, embodiments should not be construed as limited to the particular shapes of regions illustrated herein but are to include deviations in shapes that result from, e.g., manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may be executed in the reverse order, depending upon the functionality/acts involved.

FIG. 1 illustrates a schematic cross-sectional view showing a stacked semiconductor device 100 in accordance with an exemplary embodiment.

Referring to FIG. 1, the stacked semiconductor device 100 includes a first semiconductor die 110 and a second semiconductor die 140. The first semiconductor die 110 may include a first front side electrically coupled to a substrate pad 111 and an external connector 112, a backside that opposes the first front side, a first integrated circuit 124, at least one first electrostatic discharge protection circuit (ESD) 123, and at least one through-silicon-via (TSV) 121. The external connector 112 may be connected to an exterior, e.g., an exterior of the stacked semiconductor device 100.

A plurality of TSVs 121 may penetrate the first semiconductor die 110 and extend to the backside thereof. The TSVs 121 may be coupled to the first integrated circuit 124 and first ESDs 123. The first semiconductor die 110 may include a dielectric material 122 that isolates the TSVs 121 from other portions of the first semiconductor die 110. For example, the dielectric material 122 may surround the TSVs 121 so that sidewalls of the TSVs 121 are enclosed, e.g., completely enclosed, by the dielectric material 122.

The second semiconductor die 140 may be stacked above the backside of the first semiconductor die 110, e.g., a second front side of the second semiconductor die 140 may be adjacent to or face the backside of the first semiconductor die 110. The second semiconductor die 140 may include a second integrated circuit 154 electrically connected to the TSVs 121 that extend through the backside of the first semiconductor die 110. The second semiconductor die 140 may include second ESDs 153 electrically disconnected from the TSVs 121, which TSVs 121 extend through the first semiconductor die 110.

In FIG. 1, the first semiconductor die 110 is illustrated as including one ESD and one TSV, and the second semiconductor die 140 is illustrated as including one ESD and one TSV connected thereto. However, embodiments are not limited thereto, e.g., the first semiconductor die 110 may include more than one ESD and TSV, and the second semiconductor die 140 may include more than one ESD and may be connected to more than one TSV.

The stacked semiconductor device 100 may further include an interposer substrate 180. The interposer substrate 180 may be, e.g., a printed circuit board (PCB). According to an exemplary embodiment, the interposer substrate 180 may electrically couple the first semiconductor die 110 and the second semiconductor die 140 to a memory controller, etc. The interposer substrate 180 may include conductive lines 181 and 182. For example, the conductive line 181 may be coupled to the first front side of the first semiconductor die via the substrate pad 111 and the external connector 112.

The first semiconductor die 110 may include a cut-off circuit 125, e.g., for electrically disconnecting the first ESDs 123 from the TSVs 121. Further, the second semiconductor die 140 may include a cut-off circuit 155, e.g., for electrically disconnecting the second ESDs 153 from the TSVs 121. The cut-off circuits 125 and 155 may each be one of, e.g., an anti-fuse circuit or an electric fuse circuit.

According to an exemplary embodiment, the cut-off circuit 125 included in the first semiconductor die 110 may disable a cut-off signal SCO so that the first ESDs 123 may not be electrically disconnected from the TSVs 121. The cut-off circuit 155 included in the second semiconductor die 140 may enable the cut-off signal SCO to electrically disconnect the second ESDs 153 from the TSVs 121.

The first semiconductor die 110 may include a silicon substrate 120 and a metal layer 130. The silicon substrate 120 may include the first integrated circuit 124, the first ESDs 123, and the TSVs 121. The metal layer 130 may be adjacent to the silicon substrate 120, e.g., may be disposed along one lateral side of the silicon substrate 120. The metal layer 130 may be electrically coupled to the first integrated circuit 124. The metal layer 130 may electrically couple the first ESDs 123 and the TSVs 121 to one another and may electrically couple the first integrated circuit 124, the first ESDs 123, and the TSVs 121 to the substrate pad 111 and the external connector 112.

The metal layer 130 may include a first conductive line 131, a second conductive line 132, and contacts 133. The first conductive line 131 may electrically couple the first integrated circuit 124, the first ESDs 123, and the TSVs 121 to one another. The second conductive line 132 may be electrically coupled to the external connector 112. The second conductive line 132 may be electrically coupled to the external connector 112 through the substrate pad 111. The contacts 133 may electrically couple the first conductive line 131 and the second conductive line 132 to each other, e.g., a plurality of the contacts 133 may be arranged between the first conductive line 131 and the second conductive line 132.

The TSVs 121 may extend from the backside of the first semiconductor die 110 to a boundary surface of the silicon substrate 120 and the metal layer 130. The TSVs 121 may be directly coupled to the first conductive line 131.

The second semiconductor die 140 may include a silicon substrate 150 and a metal layer 160. The silicon substrate 150 may include the second integrated circuit 154 and the second ESDs 153. The metal layer 160 may be adjacent to the silicon substrate 150, e.g., may be disposed along one lateral side of the silicon substrate 150. The metal layer 160 may electrically couple the second integrated circuit 154, the second ESDs 153, and the TSVs 121 to one another.

The metal layer 160 may include a third conductive line 161*a* and 161*b*, a fourth conductive line 162*a* and 162*b*, and contacts 143. The third conductive line 161*a* and 161*b* may electrically couple the second integrated circuit 154 and the second ESDs 153 to one another. The fourth conductive line 162*a* and 162*b* may be electrically coupled to an internal connector 142. The internal connector 142 may be disposed adjacent to the metal layer 160 and may be electrically coupled to the TSVs 121. For example, the internal connector 142 may be between the metal layer 160 and the TSVs 121. The fourth conductive line 162*a* and 162*b* may be electrically coupled to the TSVs 121 through the internal connector 142. Further, a pad 141 may be coupled to the fourth conductive line 162*a* and 162*b*. The contacts 143 may electrically couple the third conductive line 161*a* and 161*b* to the fourth conductive line 162*a* and 162*b*. For example, a plurality of the contacts 142 may be arranged between the third conductive line 161*a* and 161*b* and the fourth conductive line 162*a* and 162*b*.

The silicon substrate 150 may include the cut-off circuit 155, e.g., for electrically disconnecting the second ESDs 153 from the TSVs 121. As shown in FIG. 1, according to an exemplary embodiment, the cut-off area COA of the first semiconductor die 110 may not be cut off, but the cut-off area COA of the second semiconductor die 140 may be cut off.

When the cut-off area COA of the second semiconductor die 140 is cut off, the third conductive line 161*a* and 161*b* may be discontinuous to form one third conductive line portion 161*a* and another third conductive line portion 161*b*, which may be electrically disconnected from each other. The fourth conductive line 162*a* and 162*b* may be discontinuous to form one fourth conductive line portion 162*a* and another fourth conductive line portion 162*b*, which may be electrically disconnected from each other. The one fourth conductive line portion 162*a* may be electrically coupled to the pad 141 and may be electrically disconnected from the internal connector 142. The other fourth conductive line portion 162*b* may be electrically coupled to the internal connector 142 and may be electrically disconnected from the pad 141.

In the exemplary embodiment illustrated in FIG. 1, the stacked semiconductor device 100 may decrease loading of the ESDs, e.g., because only the first ESDs 123 included in the first semiconductor die 110 disposed nearest to the substrate pad 111 are enabled. Further, the stacked semiconductor device 100 may, e.g., improve signal integrity and decrease power consumption because the loading of the ESDs may be decreased.

The stacked semiconductor device 100 of FIG. 1 may be fabricated using, e.g., a via-middle process. However, embodiments are not limited thereto.

Figure 2:
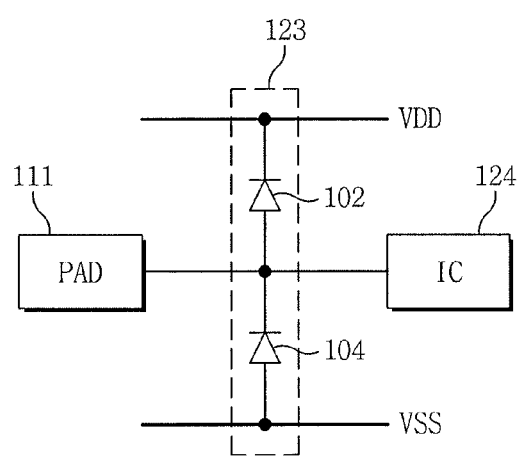
FIG. 2 illustrates a circuit diagram showing an exemplary embodiment of an electrostatic discharge protection circuit (ESD) included in the stacked semiconductor device of FIG. 1.

FIG. 2 illustrates a circuit diagram showing an exemplary embodiment of an ESD 123 included in the stacked semiconductor device 100 of FIG. 1.

As shown in FIG. 2, the ESD 123 may include diodes 102 and 104. The diodes 102 and 104 may be serially connected to each other between the high supply voltage VDD and the low supply voltage VSS. The ESD 123 may, e.g., maintain a voltage of the node between the substrate pad 111 and the integrated circuit 124 at a certain range.

Figure 3:
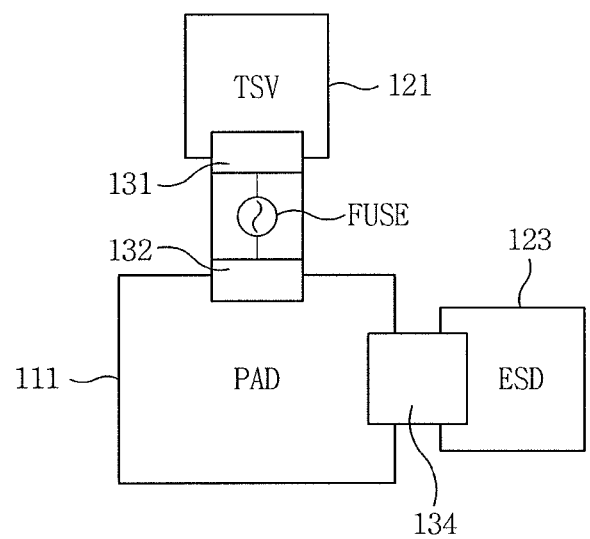
FIG. 3 illustrates a plan view showing an electrical connection between a pad and a through-silicon-via (TSV) in the first semiconductor die included in the stacked semiconductor device of FIG. 1.

FIG. 3 illustrates a plan view showing an electrical connection between the substrate pad 111 and one of the TSVs 121 in the first semiconductor die 110 included in the stacked semiconductor device 100 of FIG. 1.

Referring to FIG. 3, the substrate pad 111 and the TSVs 121 may be electrically connected through conductive lines 131 and 132 and a fuse FUSE. The cut-off circuit 125 included in the first semiconductor die 110 may leave the fuse in an on state and the cut-off area COA in a non-cut-off state by disabling the cut-off signal SCO. In FIG. 3, the substrate pad 111 and the ESDs 123 may be electrically connected through a conductive line portion 134, e.g., the conductive line portion 134 may be part of one of the first conductive line 131 and the second conductive line 132. The first conductive line 131 and the second conductive line 132 may be formed using the same metal layer, except the conductive line portion 134 may be formed using a metal layer different from that of the first conductive line 131 and the second conductive line 132.

Figure 4:
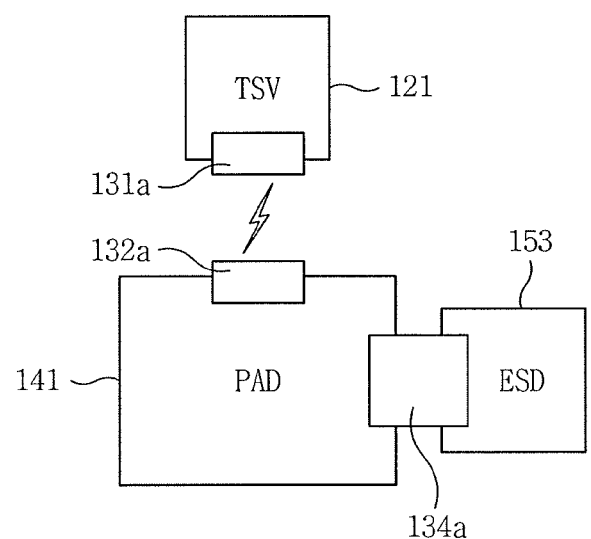
FIG. 4 illustrates a plan view showing an electrical connection between a pad and a TSV in the second semiconductor die included in the stacked semiconductor device of FIG. 1.

FIG. 4 illustrates a plan view showing an electrical connection between the pad 141 and one of the TSVs 121 in the second semiconductor die 140 included in the stacked semiconductor device 100 of FIG. 1.

Referring to FIG. 4, the pad 141 and the TSVs 121 may be electrically connected through the conductive lines 131a, 132a, and the fuse before a fusing operation. The cut-off circuit 155 of the second semiconductor die 140 may cut the fuse FUSE and cut off the cut-off area COA of the second semiconductor die 140. In FIG. 4, the pad 141 and the ESDs 153 may be electrically connected through the conductive lines 134a. The conductive line 131a and the conductive line 132a may be formed using the same metal layer, and the conductive line 134a may be formed using a metal layer different from that of the conductive line 131a and the conductive line 132a. For example, the conductive lines 131a, 132a, and 134a may correspond to the conductive lines 162b, 162a, and 161a, respectively.

The cut-off circuits 125 and 155 may be electric fuses (e-fuses) or anti-fuses. The cut-off areas COA of the first semiconductor die 110 and the second semiconductor die 140 may be cut off using, e.g., a laser fuse.

Referring to FIG. 1, FIG. 3 and FIG. 4, a method of fabricating a stacked semiconductor device according to exemplary embodiments may include forming a first semiconductor die, forming a second semiconductor die, stacking the second semiconductor die over the first semiconductor die, and performing a fusing operation with respect to the second semiconductor die to cut off ESDs included in the second semiconductor die. Therefore, the stacked semiconductor device 100 may decrease loading of the ESDs because only the first ESDs included in the semiconductor die 110 disposed nearest to the substrate pad 111 are enabled.

Performing a fusing operation with respect to the second semiconductor die 140 may include, e.g., disconnecting the pad 141 electrically connected to the ESDs 153 from TSVs 121 using an anti-fuse.

Figure 5:
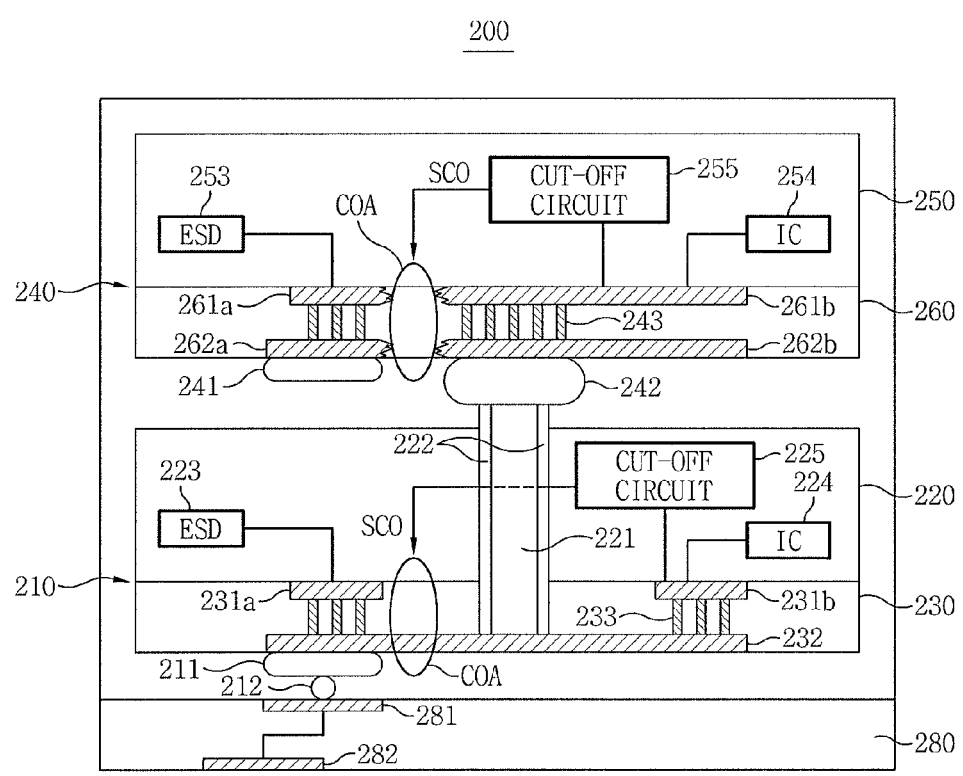
FIG. 5 illustrates a schematic cross-sectional view showing a stacked semiconductor device, in accordance with an exemplary embodiment.

FIG. 5 illustrates a schematic cross-sectional view showing a stacked semiconductor device 200 in accordance with another exemplary embodiment.

Referring to FIG. 5, the stacked semiconductor device 200 may include a first semiconductor die 210 and a second semiconductor die 240. The first semiconductor die 210 may include a first front side electrically coupled to a substrate pad 211 and an external connector 212, a backside, a first integrated circuit 224, first ESDs 223, and TSVs 221. The TSVs 221 are coupled to the first integrated circuit 224 and the first ESDs 223. The external connector 212 may be connected to an exterior, e.g., an exterior of the stacked semiconductor device 200. The first semiconductor die 210 may include a dielectric material 222 that isolates the TSVs 221 from other portions of the first semiconductor die 210.

The second semiconductor die 240 may be stacked above the backside of the first semiconductor die 210. The second semiconductor die 240 may include a second integrated circuit 254 electrically connected to the TSVs 221 and second ESDs 253 electrically disconnected from the TSVs 221. The TSVs 221 may penetrate the first semiconductor die 210 and extend to the backside of the first semiconductor die 210.

In FIG. 5, the first semiconductor die 210 is illustrated as including one ESD and one TSV, and the second semiconductor die 240 is illustrated as including one ESD. However, embodiments are not limited thereto, e.g., the first semiconductor die 210 may include more than one ESD and TSV, and the second semiconductor die 240 may include more than one ESD and may be connected to more than one TSV.

The stacked semiconductor device 200 of FIG. 5 may further include an interposer substrate 280. The interposer substrate 280 may be a PCB. According to an exemplary embodiment, the interposer substrate 280 may electrically couple the first semiconductor die 210 and the second semiconductor die 240 to a memory controller, etc. The interposer substrate 280 may include conductive lines 281 and 282.

The first semiconductor die 210 may include a cut-off circuit 225, e.g., for electrically disconnecting the first ESDs 223 from the TSVs 221. Further, the second semiconductor die 240 may include a cut-off circuit 255, e.g., for electrically disconnecting the second ESDs 253 from the TSVs 221. The cut-off circuits 225 and 255 may each be one of, e.g., an anti-fuse circuit or an e-fuse circuit.

According to an exemplary embodiment, the cut-off circuit 225 included in the first semiconductor die 210 may disable a cut-off signal SCO so that the first ESDs 223 may not be electrically disconnected from the TSVs 221. The cut-off circuit 255 included in the second semiconductor die 240 may enable the cut-off signal SCO to electrically disconnect the second ESDs 253 from the TSVs 221.

The first semiconductor die 210 may include a silicon substrate 220 and a metal layer 230. The silicon substrate 220 may include the first integrated circuit 224, the first ESDs 223, and the TSVs 221. The metal layer 230 may be adjacent to the silicon substrate 220, e.g., may be disposed along one lateral side of the silicon substrate 120. The metal layer 230 may electrically couple the first integrated circuit 224, the first ESDs 223, and the TSVs 221 to one another, and may electrically couple the first integrated circuit 224, the first ESDs 223, and the TSVs 221 to the substrate pad 211 and the external connector 212.

The metal layer 230 may include first conductive lines 231a and 231b, a second conductive line 232, and contacts 233. The first conductive lines 231a and 231b may be discontinuous and separated into at least two portions connected to different components of the first semiconductor die 210. For example, first conductive line 231a may be electrically coupled to the first ESDs 223 and may be arranged spaced apart from the TSVs 221 and the first integrated circuit 224. The first conductive line 231b may be electrically coupled to the first integrated circuit 224 and may be arranged spaced apart from the TSVs 221 and the first ESDs 223.

The second conductive line 232 may be electrically coupled to the external connector 212. The second conductive line 232 may be electrically coupled to the external connector 212 through the substrate pad 211. The second conductive line 232 may electrically couple the first integrated circuit 224, the first ESDs 223, and the TSVs 221 to one another. The TSVs may be directly coupled to the second conductive line 232. The contacts 233 may electrically couple the first conductive lines 231a and 231b to the second conductive line 232.

The TSVs 221 may penetrate the silicon substrate 220. The TSVs 221 may extend from the backside of the first semiconductor die 210 to a boundary surface of the silicon substrate 220 and the metal layer 230.

The second semiconductor die 240 may include a silicon substrate 250 and a metal layer 260. The silicon substrate 250 may include the second integrated circuit 254 and the second ESDs 253. The metal layer 260 may be adjacent to the silicon substrate 250, e.g., may be disposed along one lateral side of the silicon substrate 250. The metal layer 260 may electrically couple the second integrated circuit 254, the second ESDs 253, and the TSVs 221 to one another.

The metal layer 260 may include a third conductive line 261a and 261b, a fourth conductive line 262a and 262b, and contacts 243. The third conductive line 261a and 261b may electrically couple the second integrated circuit 254 and the second ESDs 253 to one another. The fourth conductive line 262a and 262b may be electrically coupled to an internal connector 242. For example, the internal connector 242 may be between the metal layer 260 and the TSVs 221. The contacts 243 may electrically couple the third conductive line 261a and 261b and the fourth conductive line 262a and 262b to each other. The fourth conductive line 262a and 262b may be electrically coupled to the TSVs 221 through the internal connector 242. Further, a pad 241 may be coupled to the fourth conductive line 262a and 262b.

The silicon substrate 250 may include a cut-off circuit 255, e.g., for electrically disconnecting the second ESDs 253 from the TSVs 221. As shown in FIG. 5, the cut-off area COA of the first semiconductor die 210 may not be cut off, but the cut-off area COA of the second semiconductor die 240 may be cut off. For example, the cut-off circuits 225 and 255 may be substantially the same as or similar to the cut-off circuits 125 and 155, respectively, of FIG. 1.

The stacked semiconductor device 200 may decrease loading of the ESDs because only the first ESDs 223 included in the first semiconductor die 210 disposed nearest to the substrate pad 211 may be enabled. Further, the stacked semiconductor device 200 may improve signal integrity and decrease power consumption because the loading of the ESDs is decreased.

The stacked semiconductor device 200 of FIG. 5 may be fabricated using a via-last process. However, embodiments are not limited thereto.

Figure 6:
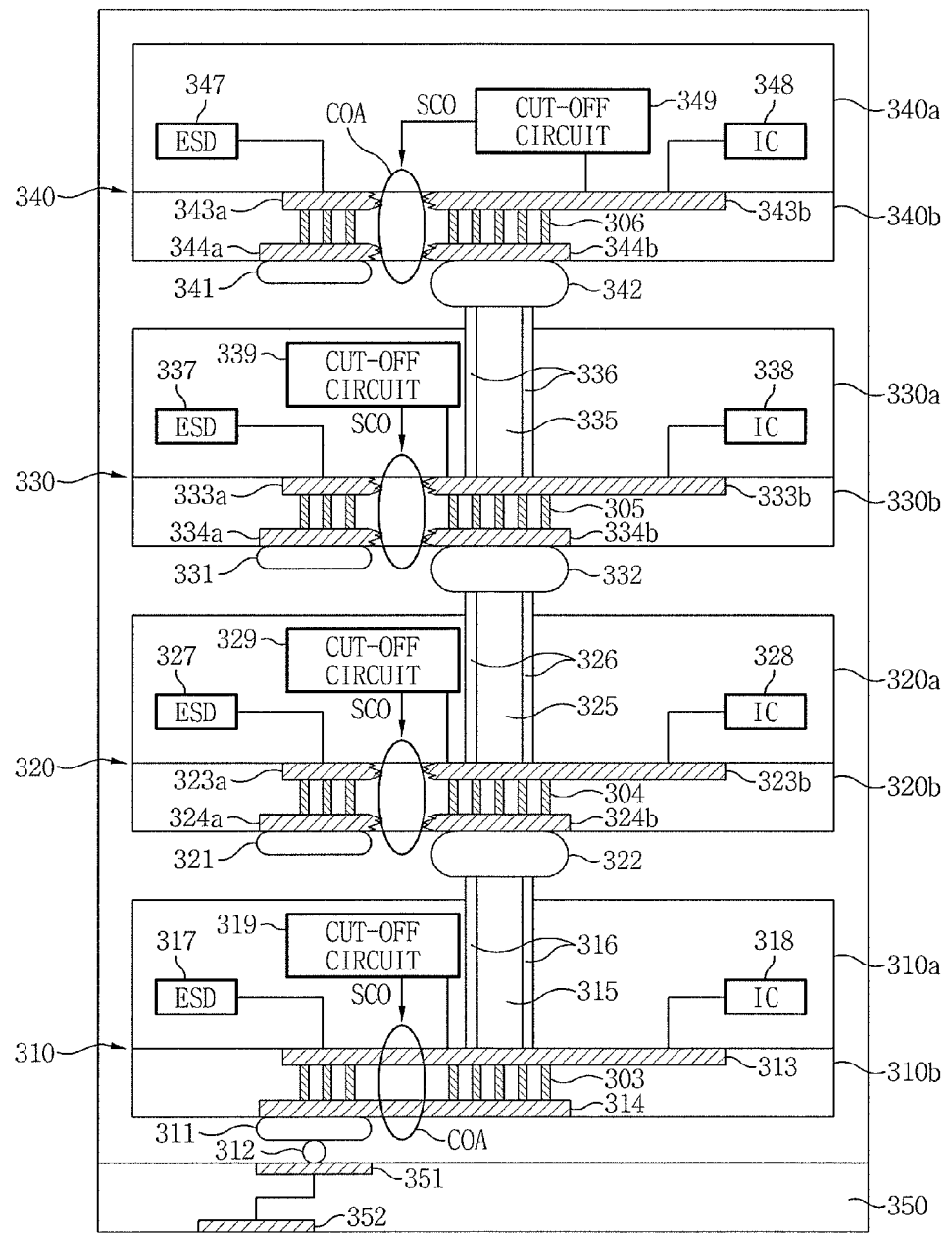
FIG. 6 illustrates a schematic cross-sectional view showing a stacked semiconductor device, in accordance with an exemplary embodiment.

FIG. 6 illustrates a schematic cross-sectional view showing a stacked semiconductor device 300 in accordance with still another exemplary embodiment.

Referring to FIG. 6, the stacked semiconductor device 300 may include a first semiconductor die 310, a second semiconductor die 320, a third semiconductor die 330, and a fourth semiconductor die 340.

The first semiconductor die 310 may include a front side electrically coupled to a substrate pad 311 and an external connector 312, a backside, a first integrated circuit 318, first ESDs 317, and first TSVs 315. The first TSVs 315 may be electrically coupled to the first integrated circuit 318 and the first ESDs 317. The first semiconductor die 310 may include a dielectric material 316 that isolates the first TSVs 315 from other portions of the first semiconductor die 310. The first TSVs 315 may penetrate the first semiconductor die 310 and may extend to the backside of the first semiconductor die 310.

The second semiconductor die 320 may be stacked above the first semiconductor die 310. The second semiconductor die 320 may include a front side electrically coupled to the first TSVs 315, a backside, a second integrated circuit 328, second ESDs 327, and second TSVs 325. The second TSVs 325 may be electrically coupled to the second integrated circuit 328 and the second ESDs 327. The second semiconductor die 320 may include a dielectric material 326 that isolates the second TSVs 325 from other portions of the second semiconductor die 320. The second TSVs 325 may penetrate the second semiconductor die 320 and may extend to the backside of the second semiconductor die 320.

The third semiconductor die 330 may be stacked above the second semiconductor die 320 and the first semiconductor die 310. The third semiconductor die 330 may include a front side electrically coupled to the second TSVs 325, a backside, a third integrated circuit 338, third ESDs 337, and third TSVs 335. The third TSVs 325 may be electrically coupled to the third integrated circuit 338 and the third ESDs 337. The third semiconductor die 330 may include a dielectric material 336 that isolates the third TSVs 335 from other portions of the third semiconductor die 330. The third TSVs 335 may penetrate the third semiconductor die 330 and extend to the backside of the third semiconductor die 330.

The fourth semiconductor die 340 may be stacked above the third semiconductor die 330, the second semiconductor die 320, and the first semiconductor die 310. The fourth semiconductor die 340 may include a fourth integrated circuit 348 electrically coupled to the third TSVs 335 and fourth ESDs 347 electrically disconnected from the third TSVs 335.

In FIG. 6, the first to third semiconductor dies 310, 320 and 330 are illustrated as including one ESD and one TSV, and the fourth semiconductor die 340 is illustrated as including one ESD. However, embodiments are not limited thereto, e.g., the first to third semiconductor dies 310, 320 and 330 may include more than one ESD and TSV and the second semiconductor die 240 may include more than one ESD.

The stacked semiconductor device 300 of FIG. 6 may further include an interposer substrate 350. The interposer substrate 350 may be a PCB, and may electrically couple the first to fourth semiconductor dies 310, 320, 330, and 340 to a memory controller, etc. The interposer substrate 350 may include conductive lines 351 and 352.

The second to fourth semiconductor dies 320, 330, and 340 may include cut-off circuits 329, 339, and 349, respectively. The cut-off circuits 329, 339, and 349 may be, e.g., for electrically disconnecting the ESDs 327, 337, and 347, respectively, from the TSVs 325 and/or 335. Each of the cut-off circuits 329, 339, or 349 may be an anti-fuse circuit or an e-fuse circuit. Further, the first semiconductor die 310 may include a cut-off circuit 319, e.g., for electrically disconnecting the first ESDs 317 from the TSVs 315.

The cut-off circuit 319 included in the first semiconductor die 310 may disable a cut-off signal SCO so that the first ESDs 317 are not electrically disconnected from the TSVs 315. Each of the cut-off circuits 329, 339, and 349 included in the second to fourth semiconductor dies 320, 330, and 340, respectively, may enable the cut-off signal SCO to electrically disconnect the ESDs 327, 337, and 347, respectively, from the TSVs 325 and/or 335.

The first semiconductor die 310 may include a silicon substrate 310a and a metal layer 310b. The silicon substrate 310a may include the first integrated circuit 318, the first ESDs 317, and the TSVs 315. The metal layer 310b may be adjacent to the silicon substrate 310a. The metal layer 310b may electrically couple the first integrated circuit 318, the first ESDs 317, and the TSVs 315 to one another and may electrically couple the first integrated circuit 318, the first ESDs 317, and the TSVs 315 to the substrate pad 311 and the external connector 312.

The metal layer 310b may include a first conductive line 313, a second conductive line 314, and contacts 303. The first conductive line 313 may electrically couple the first integrated circuit 318, the first ESDs 317, and the TSVs 315 to one another. The second conductive line 314 may be electrically coupled to the external connector 312. The contacts 303 may electrically couple the first conductive line 313 and the second conductive line 314 to each other. The second conductive line 314 may be electrically coupled to the external connector 312 through the substrate pad 311. The TSVs 315 may extend from the backside of the first semiconductor die 310 to a boundary surface of the silicon substrate 310a and the metal layer 310b.

The second semiconductor die 320 may include a silicon substrate 320a and a metal layer 320b. The silicon substrate 320a may include the second integrated circuit 328 and the second ESDs 327. The metal layer 320b may be adjacent to the silicon substrate 320a. The metal layer 320b may electrically couple the second integrated circuit 328, the second ESDs 327, and the TSVs 315 and 325 to one another.

The metal layer 320b may include a third conductive line 323a and 323b, a fourth conductive line 324a and 324b, and contacts 304. The third conductive line 323a and 323b may electrically couple the second integrated circuit 328, the second ESDs 327, and the TSVs 325 to one another. The fourth conductive line 324a and 324b may be electrically coupled to the internal connector 322. The fourth conductive line 324a and 324b may be electrically coupled to the TSVs 315 through the internal connector 322. The contacts 304 may electrically couple the third conductive line 323a and 323b and the fourth conductive line 324a and 324b to each other.

The TSVs 315 may extend from the backside of the first semiconductor die 310 to a boundary surface of the silicon substrate 310a and the metal layer 310b. Further, a pad 321 may be coupled to the fourth conductive line 324a and 324b, e.g., may be coupled directly to one fourth conductive line portion 324a. The silicon substrate 320b may include a cut-off circuit 329, e.g., for electrically disconnecting the ESDs 327 from the TSVs 315. The ESDs 327 may also be electrically disconnected from the TSVs 315 and/or 325.

The third semiconductor die 330 may include a silicon substrate 330a and a metal layer 330b. The silicon substrate 330a may include the third integrated circuit 338 and the third ESDs 337. The metal layer 330b may be adjacent to the silicon substrate 330a and may electrically couple the third integrated circuit 338, the third ESDs 337, and the TSVs 325 and/or 335 to one another.

The metal layer 330b may include a fifth conductive line 333a and 333b, a sixth conductive line 334a and 334b, and contacts 305. The fifth conductive line 333a and 333b may electrically couple the third integrated circuit 338, the third ESDs 337, and the TSVs 335 to one another. The sixth conductive line 334a and 334b may be electrically coupled to an internal connector 332. The internal connector 332 may be coupled, e.g., electrically coupled, to the TSVs 325. Further, a pad 331 may be coupled to the sixth conductive line 334a and 334b. The contacts 305 electrically couple the fifth conductive line 333a and 333b and the sixth conductive line 334a and 334b to each other. The silicon substrate 330b may include the cut-off circuit 339, e.g., for electrically disconnecting the ESDs 337 from the TSVs 325.

The fourth semiconductor die 340 may include a silicon substrate 340a and a metal layer 340b. The silicon substrate 340a may include the fourth integrated circuit 348 and the fourth ESDs 347. The metal layer 340b may be adjacent to the silicon substrate 340a. The metal layer 340b may electrically couple the fourth integrated circuit 348, the fourth ESDs 347, and the TSVs 335 to one another.

The metal layer 340b may include a seventh conductive line 343a and 343b, an eighth conductive line 344a and 344b, and contacts 306. The seventh conductive line 343a and 343b may electrically couple the fourth integrated circuit 348 and the fourth ESDs 347 to one another. The eighth conductive line 344a and 344b may be electrically coupled to the internal connector 342. The eighth conductive line 344a and 344b may be electrically coupled to the TSVs 335 through the internal connector 342. According, the fourth integrated circuit 348, the fourth ESDs 347, and the TSVs 335 may be electrically coupled to one another. Further, a pad 341 may be coupled to the eighth conductive line 344a and 344b. The contacts 306 may electrically couple the seventh conductive line 343a and 343b and the eighth conductive line 344a and 344b to each other.

The silicon substrate 340b may include a cut-off circuit 349, e.g., for electrically disconnecting the ESDs 347 from the TSVs 335.

As shown in FIG. 6, the cut-off area COA of the first semiconductor die 310 may not be cut off, but the cut-off areas COA of the second to fourth semiconductor dies 320, 330, and 340 may be cut off.

The stacked semiconductor device 300 may decrease loading of the ESDs because only the first ESDs 317 included in the semiconductor die disposed nearest to the substrate pad 311 may be enabled. Further, the stacked semiconductor device 300 may, e.g., improve signal integrity and decrease power consumption because the loading of the ESDs is decreased.

The stacked semiconductor device 300 of FIG. 6 may be fabricated using, e.g., a via-middle process. However, embodiments are not limited thereto.

Figure 7:
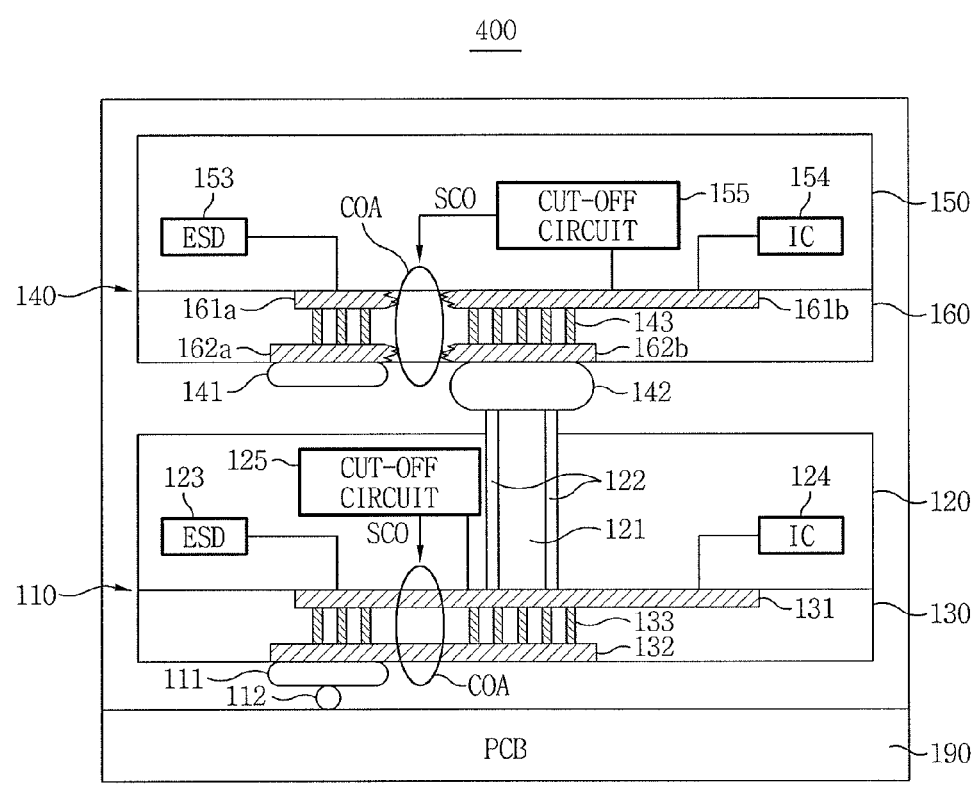
FIG. 7 illustrates a schematic cross-sectional view showing a stacked semiconductor device, in accordance with an exemplary embodiment.

FIG. 7 illustrates a schematic cross-sectional view showing a stacked semiconductor device 400 in accordance with yet another exemplary embodiment.

Referring to FIG. 7, the stacked semiconductor device 400 may include a first semiconductor die 110, a second semiconductor die 140, and a PCB 190.

The stacked semiconductor device 400 of FIG. 7 may include a structure in which the PCB 190 is coupled to the external connector 112 instead of the interposer substrate 180 coupled to the first semiconductor die 110 in the stacked semiconductor device 100 of FIG. 1. The first semiconductor die 110 and the second semiconductor die 140 may, e.g., receive and transmit commands, addresses, and/or data through TSVs 121 and the PCB 190 with the exterior.

Figure 8:
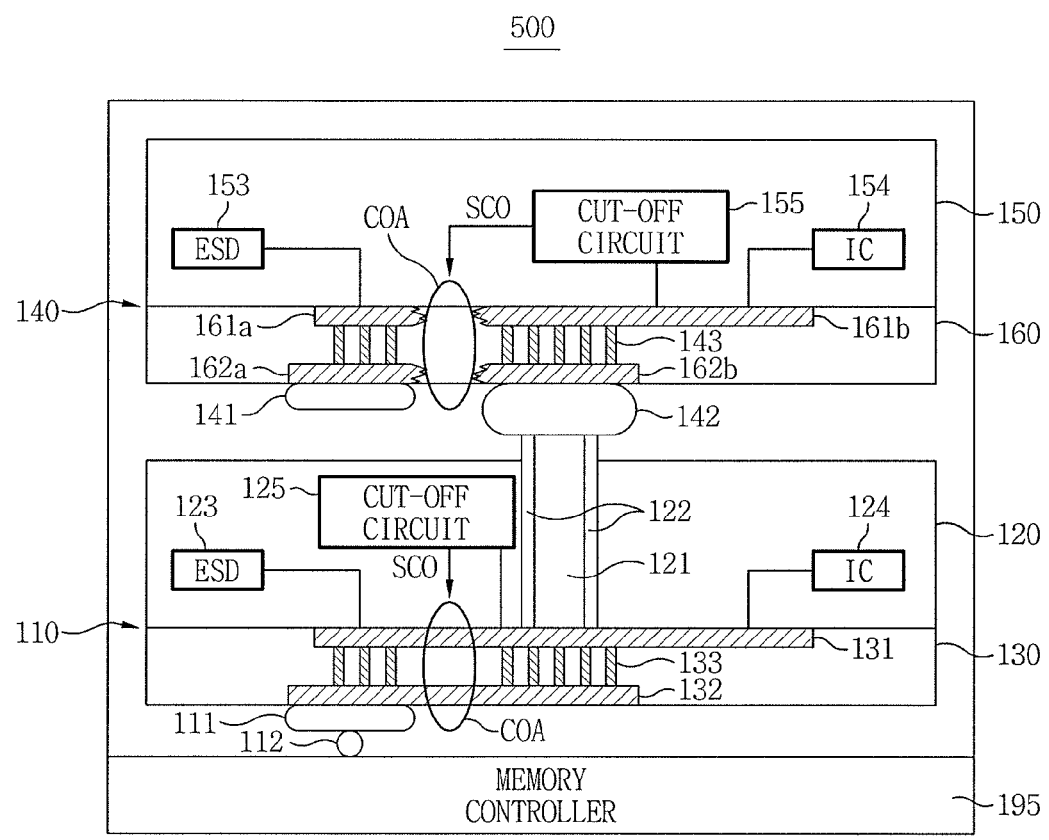
FIG. 8 illustrates a schematic cross-sectional view showing a memory system including a stacked semiconductor memory device, in accordance with exemplary embodiments.

FIG. 8 illustrates a cross-sectional view showing a memory system 500 including a stacked semiconductor memory device in accordance with exemplary embodiments.

The memory system 500 of FIG. 8 may have a structure in which a memory controller 195 is coupled to the external connector 112 coupled to the first semiconductor die 110 without the interposer substrate 180 in the stacked semiconductor device 100 of FIG. 1. The first semiconductor die 110 and the second semiconductor die 140 may, e.g., receive and transmit commands, addresses, and/or data through TSVs 121 and the PCB 190 with the memory controller 195.

The stacked semiconductor device according to exemplary embodiments may, e.g., decrease loading of the ESDs because only the ESDs included in the semiconductor die disposed nearest to the substrate pad are enabled. Further, the stacked semiconductor device may, e.g., improve signal integrity and decrease power consumption because the loading of the ESDs is decreased.

By way of summation and review, a stacked semiconductor device may include semiconductor chips that are three-dimensionally arranged and that are electrically connected to each other by through silicon vias (TSVs) for, e.g., ultra-high speed communication between semiconductor integration circuits. Semiconductor dies including in the stacked semiconductor device may include electrostatic discharge protection circuits (ESDs) to protect internal circuits. Further, a module or system using the three-dimensionally stacked semiconductor chips may have a smaller size and a lighter weight than that of a module or system using two-dimensionally stacked semiconductor chips.

When the electrostatic discharge protection circuits included in the stacked semiconductor devices, e.g., in all the stacked semiconductor devices, are kept turned ON, loads due to the electrostatic discharge protection circuits may be increased, which may cause a decrease in signal integrity and an increase in power consumption.

In contrast, according to exemplary embodiments, e.g., the exemplary embodiments discussed above, since a stacked semiconductor device enables only electrostatic discharge protection circuits included in a semiconductor die most adjacent to a substrate pad, loads due to the electrostatic discharge protection circuits may be reduced. In addition, since the stacked semiconductor device reduces the loads due to the electrostatic discharge protection circuit, signal integrity may be improved and power consumption may also be reduced. Embodiments may be applied to, e.g., a stacked semiconductor device including ESDs. Accordingly, embodiments, relate to a stacked semiconductor device that may be capable of decreasing loading of electrostatic discharge protection circuits.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A stacked semiconductor device, comprising:
   a first semiconductor die that includes a front side electrically coupled to a substrate pad, the substrate pad being connected to an exterior, a backside of the first semiconductor die, a first integrated circuit, first electrostatic discharge protection circuits (ESDs), and through-silicon-vias (TSVs), the TSVs being coupled to the first integrated circuit and the first ESDs; and
   a second semiconductor die stacked above the backside of the first semiconductor die, the second semiconductor die including a second integrated circuit that is electrically connected to the TSVs and second ESDs, the second ESDs being electrically disconnected from the TSVs,
   wherein the TSVs penetrate the first semiconductor die and extend to the backside of the first semiconductor die.

2. The stacked semiconductor device as claimed in claim 1, further comprising an interposer substrate coupled to the substrate pad.

3. The stacked semiconductor device as claimed in claim 1, further comprising a printed circuit board coupled to the substrate pad.

4. The stacked semiconductor device as claimed in claim 1, wherein the second semiconductor die includes a cut-off circuit that electrically disconnects the second ESDs from the TSVs.

5. The stacked semiconductor device as claimed in claim 4, wherein the cut-off circuit is an anti-fuse circuit or an electric fuse circuit.

6. The stacked semiconductor device as claimed in claim 1, wherein the second ESDs are electrically disconnected from the second integrated circuit.

7. The stacked semiconductor device as claimed in claim 1, wherein the first semiconductor die includes:
   a first silicon substrate including the first integrated circuit, the first ESDs, and the TSVs; and
   a first metal layer adjacent to the first silicon substrate, the first metal layer electrically coupling the first integrated circuit, the first ESDs, and the TSVs to one another and electrically coupling the first integrated circuit, the first ESDs, and the TSVs to the substrate pad.

8. The stacked semiconductor device as claimed in claim 7, wherein the first metal layer includes:
   a first conductive line that electrically couples the first integrated circuit, the first ESDs, and the TSVs to one another;
   a second conductive line electrically coupled to the substrate pad; and
   contacts that electrically couple the first conductive line and the second conductive line to each other.

9. The stacked semiconductor device as claimed in claim 7, wherein the TSVs extend from the backside of the first semiconductor die to a boundary surface of the first silicon substrate and the first metal layer.

10. The stacked semiconductor device as claimed in claim 7, wherein the TSVs extend through the first silicon substrate from the backside of the first semiconductor die to the first metal layer.

11. The stacked semiconductor device as claimed in claim 1, wherein the second semiconductor die includes:
   a second silicon substrate including the second integrated circuit and the second ESDs; and
   a second metal layer adjacent to the second silicon substrate, the second metal layer electrically coupling the second integrated circuit, the second ESDs, and the TSVs to one another.

12. The stacked semiconductor device as claimed in claim 11, wherein the second silicon substrate includes a cut-off circuit that electrically disconnects the second ESDs from the TSVs.

13. A stacked semiconductor device, comprising:
   a first semiconductor die that includes a front side electrically coupled to a substrate pad, the substrate pad being connected to an exterior, a backside of the first semiconductor die, a first integrated circuit, first electrostatic discharge protection circuits (ESDs), and through-silicon-vias (TSVs), the TSVs being coupled to the first integrated circuit and the first ESDs;

a second semiconductor die that includes a second integrated circuit and second ESDs, the second integrated circuit being stacked above the backside of the first semiconductor die and being electrically connected to the TSVs, the second ESDs being electrically disconnected from the TSVs; and an interposer substrate coupled to the substrate pad, wherein the TSVs penetrate the first semiconductor die and extend to the backside of the first semiconductor die.

14. The stacked semiconductor device as claimed in claim 13, wherein the second semiconductor die includes a cut-off circuit that electrically disconnects the second ESDs from the TSVs.

15. The stacked semiconductor device as claimed in claim 14, wherein the cut-off circuit is an anti-fuse circuit or an electric fuse circuit.

16. A method of fabricating a stacked semiconductor device, the method comprising:

forming a first semiconductor die, the first semiconductor die including at least one first electro static discharge protection circuit (ESD), at least one through-silicon-via (TSV), and a first integrated circuit that are electrically connected to each other;

forming a second semiconductor die, the second semiconductor die being stacked on the first semiconductor die to form a stacked structure, and the second semiconductor die including at least one second ESD and a second integrated circuit; and performing a fusing operation with respect to the second semiconductor die to cut off an electrical connection between the at least one second ESD and the at least one TSV.

17. The method as claimed in claim 16, wherein the fusing operation with respect to the second semiconductor die includes disconnecting a pad electrically connected to the at least one second ESD from the at least one TSVs using an anti-fuse.

18. The method as claimed in claim 16, wherein the fusing operation includes enabling a cut-off signal of a cut-off circuit that is in the second semiconductor die.

19. The method as claimed in claim 18, wherein the fusing operation includes forming a cut-off area in the second semiconductor die, the cut-off area extending through conductive lines in the second semiconductor die such that first portions of the conductive lines are electrically connected to the at least one second ESD and second portions of the conductive lines are connected to the at least one TSV and the second integrated circuit.

20. The method as claimed in claim 16, wherein, after the fusing operation, the at least one first ESD remains electrically connected to the at least one TSV and the first integrated circuit.

* * * * *